(12) United States Patent
Lou (10) Patent No.: US 6,417,066 B1
(45) Date of Patent: Jul. 9, 2002

(54) METHOD OF FORMING A DRAM CAPACITOR STRUCTURE INCLUDING INCREASING THE SURFACE AREA USING A DISCRETE SILICON MASK

(75) Inventor: Chine-Gie Lou, Hsin-Chu Hsien (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 4 days.

(21) Appl. No.: 09/783,380

(22) Filed: Feb. 15, 2001

(51) Int. Cl.[7] .............................................. H01L 21/20
(52) U.S. Cl. ...................... 438/396; 438/239; 438/244; 438/253; 438/254; 438/255; 438/387; 438/398
(58) Field of Search .................................. 438/396–399, 438/239, 240, 244, 253–256, 387; 257/309

(56) References Cited

U.S. PATENT DOCUMENTS

| | | | |
|---|---|---|---|
| 5,478,769 A | 12/1995 | Lim .............................. 437/52 |
| 5,597,754 A | 1/1997 | Lou et al. ..................... 437/52 |
| 5,677,222 A | 10/1997 | Tseng .......................... 437/52 |
| 5,702,968 A | * 12/1997 | Chen .......................... 438/253 |
| 5,723,373 A | * 3/1998 | Chang et al. ................ 435/253 |
| 6,027,970 A | 2/2000 | Sharan et al. ............... 438/255 |
| 6,046,084 A | 4/2000 | Wei et al. .................... 438/255 |
| 6,146,968 A | * 11/2000 | Lu et al. ..................... 438/253 |

* cited by examiner

*Primary Examiner*—Caridad Everhart
*Assistant Examiner*—Craig P. Lytle
(74) *Attorney, Agent, or Firm*—George O. Saile; Stephen B. Ackerman (57) ABSTRACT

A process for fabricating a fin type, cylindrical shaped, DRAM capacitor structure, with increased surface area, has been developed. The process features forming a non-continuous layer of discrete regions of silicon, on the surface of a capacitor opening, in a composite insulator layer. The discrete regions of silicon are then used as an etch mask to allow an isotropic etching procedure to create horizontal channels in the sides of the portions of the composite insulator layer exposed in the capacitor opening, creating a capacitor opening comprised with horizontal channnels. An amorphous silicon layer is then deposited and patterned to form a fin type, storage node structure, comprised of amorphous silicon on discrete regions of silicon, in the capacitor opening. Formation of a capacitor dielectric layer, and an overlying top electrode structure, complete the formation of a fin type, cylindrical shaped, DRAM capacitor structure.

26 Claims, 6 Drawing Sheets

METHOD OF FORMING A DRAM CAPACITOR STRUCTURE INCLUDING INCREASING THE SURFACE AREA USING A DISCRETE SILICON MASK

BACKGROUND OF THE INVENTION

1. Field of the Invention

The present invention relates to methods used to fabricate semiconductor devices, and more specifically to a method used to fabricate a capacitor structure for a dynamic random access memory (DRAM), device.

2. Description of Prior Art

As the density of DRAM cells increase, the horizontal dimensions of individual DRAM devices have to be decreased, thus reducing the area available for the DRAM capacitor structure, and thus resulting in unwanted decreases in capacitor surface area. To compensate for the decrease in capacitor surface area, the DRAM industry has featured capacitor structures with increasing vertical features, thus increasing capacitor surface area, and capacitance. The increased vertical features have been achieved via use of various configurations for stacked capacitor structures, such as cylindrical shaped and crown shaped structures. In addition fin type designs have been added to these stacked capacitor structures to supply additional horizontal surface area for the capacitor structures.

This invention will teach a fabrication procedure for formation of a cylindrical shaped, capacitor structure, featuring the use of horizontal grooves, or fins, extending from the vertical sides of the cylindrical shaped capacitor, supplying the desired additional capacitor surface area. The fin type capacitor structure described in the present invention is defined in a fin type capacitor opening, which in turn is formed using a novel process sequence in which the horizontal grooves or channels, in the vertical sides of a capacitor opening, are formed using isolated regions of a conductive material as a mask to selectively, and isotropically, define these horizontal grooves. Prior art, such as Tseng, in U.S. Pat. No. 5,677,222, also describes methods of forming a fin type, DRAM capacitor structure. However the prior art offered by Tseng entails a complex process sequence in which alternating layers of dielectric layers, each having different etch rates, are subjected to a specific isotropic etch to create the fin type configuration. In contrast the present invention forms the fin type grooves in only in a single insulator layer.

SUMMARY OF THE INVENTION

It is an object of this invention to fabricate a cylindrical shaped, capacitor structure for a DRAM device, comprised with fin type features, extending horizontally from the vertical sides of the cylindrical shaped capacitor structure.

It is another object of this invention to form a capacitor opening in a thick insulator layer, to accommodate the fin type, cylindrical shaped capacitor structure, with the capacitor opening formed with horizontal grooves or channels located in the vertical sides of the thick insulator layer.

It is still another object of this invention to use discrete regions of rugged polysilicon, or hemispherical grain (HSG), silicon, deposited on the exposed surfaces of the capacitor opening, as an etch mask to isotropically define the horizontal grooves or channels in the exposed regions of the thick insulator layer.

It is still yet another object of this invention to form a fin type, storage node structure for the fin type, cylindrical shaped capacitor structure, comprised of a continuous amorphous silicon layer located in horizontal grooves in the thick insulator layer, and located overlying discrete regions of rugged polysilicon, or HSG silicon.

In accordance with the present invention a method of fabricating a fin type, cylindrical shaped DRAM capacitor structure, is described. After definition of a storage node contact hole in a first composite insulator layer, a storage node contact plug structure is formed in the storage node contact hole, overlying and contacting a source/drain region of an underlying transfer gate transistor. A capacitor opening is then formed in a second composite insulator layer, comprised of an overlying thin silicon nitride layer, and an underlying thick BPSG layer, exposing the top surface of the storage node contact plug structure. Specific deposition and anneal conditions are next used to form a non-continuous layer of discrete regions of rugged polysilicon, or hemispherical grain (HSG), silicon, on the exposed surfaces of the capacitor opening. The discrete regions of rugged polysilicon or HSG, are then used as an etch mask to allow an isotropic etch procedure to selectively form lateral grooves or channels in unprotected regions of the thick BPSG layer, resulting in a capacitor opening featuring horizontal grooves, or channels, in the sides of the thick BPSG layer, with the grooves or channels extending inwards from the vertical sides of the capacitor opening. An amorphous silicon layer is then deposited, contouring the surfaces of the horizontal grooves, as well as overlying the discrete regions of rugged polysilicon. Removal of the portions of amorphous silicon, and portions of discrete regions of polysilicon, from the top surface of the second composite insulator layer result in a storage node structure, in the capacitor opening, comprised of a continuous amorphous silicon layer, overlying discrete regions of polysilicon, and contouring or coating the surfaces of the horizontal grooves of the capacitor opening. Formation of a capacitor dielectric layer on the underlying amorphous silicon storage node structure is followed by formation of a capacitor top electrode structure, resulting in a fin type, cylindrical shaped capacitor structure, featuring the fin type, storage node structures.

An additional embodiment of this invention entails the formation of hemispherical grain (HSG), silicon, on the amorphous silicon surface of the storage node structure, prior to formation of the overlying capacitor dielectric layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a fin type, cylindrical shaped capacitor structure, for a DRAM device, will now be described in detail. P type, semiconductor substrate 1, comprised of single crystalline silicon with a <100>crystallographic orientation, is used and schematically shown in FIG. 1. Silicon dioxide gate insulator layer 2, is next the thermally grown to a thickness between about 30 to 100 Angstroms, followed by the formation of insulator capped gate structure 6. Insulator layer capped gate structure 6, is comprised of underlying, polysilicon layer 3, obtained via low pressure chemical vapor deposition (LPCVD), procedures, to a thickness between about 2000 to 4000 Angstroms, and comprised of overlying insulator layer 4, either a silicon oxide or a silicon nitride layer, obtained via LPCVD or plasma enhanced chemical vapor deposition (PECVD), procedures, to a thickness between about 500 to 2000 Angstroms. Polysilicon layer 3, is either doped in situ during deposition via the addition of arsine, or phosphine, to a silane ambient, or grown intrinsically then doped via implantation of arsenic or phosphorous ions. Conventional photolithographic and anisotropic procedures, using $CF_4$ or $CHF_3$ as an etchant for insulator layer 4, and using $Cl_2$ or $SF_6$ as an etchant for polysilicon layer 3, are employed to define insulator capped gate structures 6, shown schematically in FIG. 1. Removal of the photoresist shape used for definition of insulator capped gate structure 6, is accomplished via plasma oxygen ashing and careful wet cleans.

Figure 1:
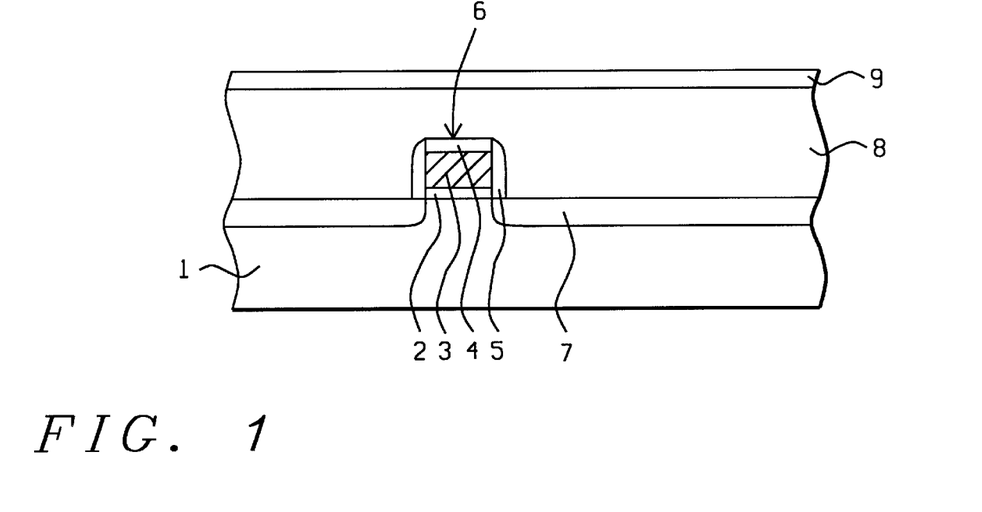
FIGS. 1–11, which schematically, in cross-sectional style, describe key fabrication stages used to create a fin type, cylindrical shaped capacitor structure, for a DRAM device.

Insulator spacers 5, are next formed on the sides of insulator capped gate structure 6. This is accomplished via deposition of a silicon nitride, or silicon layer, via LPCVD or PECVD procedures, at a thickness between about 500 to 2000 Angstroms. The silicon nitride, or silicon oxide layer, is then subjected to a blanket, anisotropic, reactive ion etching (RIE), procedure, to form insulator spacers 5, located on the sides of insulator capped gate structures 6. Source/drain regions 7, are next formed in regions of semiconductor substrate 1, not covered by insulator capped gate structures 6, or by insulator spacers 5, via implantation of arsenic or phosphorous ions. Insulator layer 8, comprised of either silicon oxide, or boro-phosphosilicate glass (BPSG), is next deposited via LPCVD or PECVD procedures, at a thickness between about 3000 to 7000 Angstroms. A chemical mechanical polishing (CMP), procedure is then employed for planarization purposes, resulting in a smooth top surface topography for insulator layer 8. Silicon nitride layer 9, is then deposited via LPCVD or PECVD procedures, at a thickness between about 500 to 1500 Angstroms. The result of these procedures is schematically shown in FIG. 1.

Figure 2:
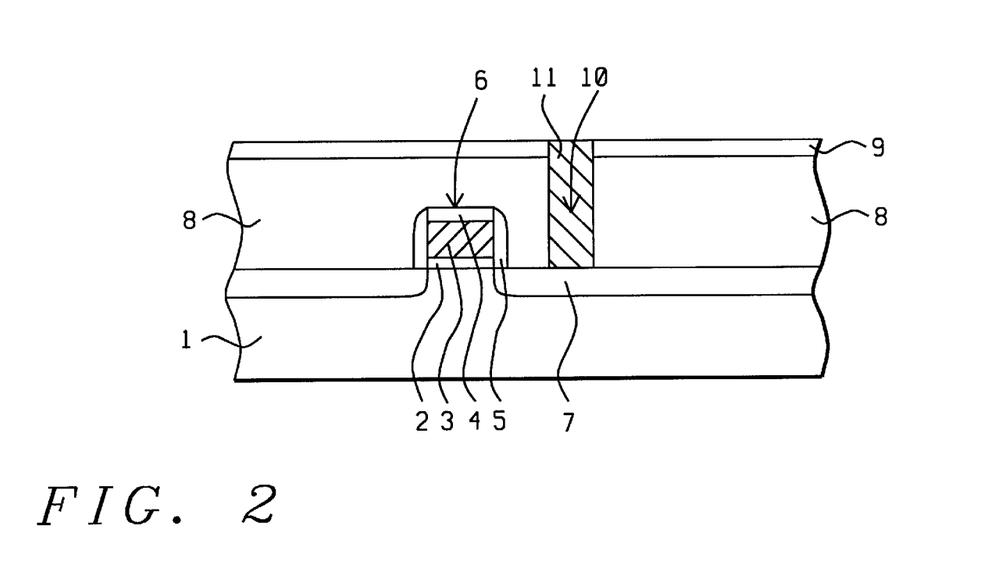

Conventional photolithographic and anisotropic RIE procedures, are now employed to create storage node contact hole 10, in silicon nitride layer 9, and in insulator layer 8, exposing a portion of the top surface of source/drain region 7. The RIE procedure is performed using $CF_4$ or $CHF_3$ as an etchant. The photoresist shape used to define storage node contact hole 10, is removed using plasma oxygen ashing and careful wet cleans. Deposition of a conductive layer such as doped polysilicon, or tungsten, is performed via LPCVD procedures, completely filling storage node contact hole 10. Removal of unwanted regions of the conductive layer, located on the top surface of silicon nitride layer 9, is next addressed using either a CMP procedure, or a selective RIE procedure, resulting in the definition of storage node contact structure 11, in storage node contact hole 10. This is schematically shown in FIG. 2.

Figure 3:
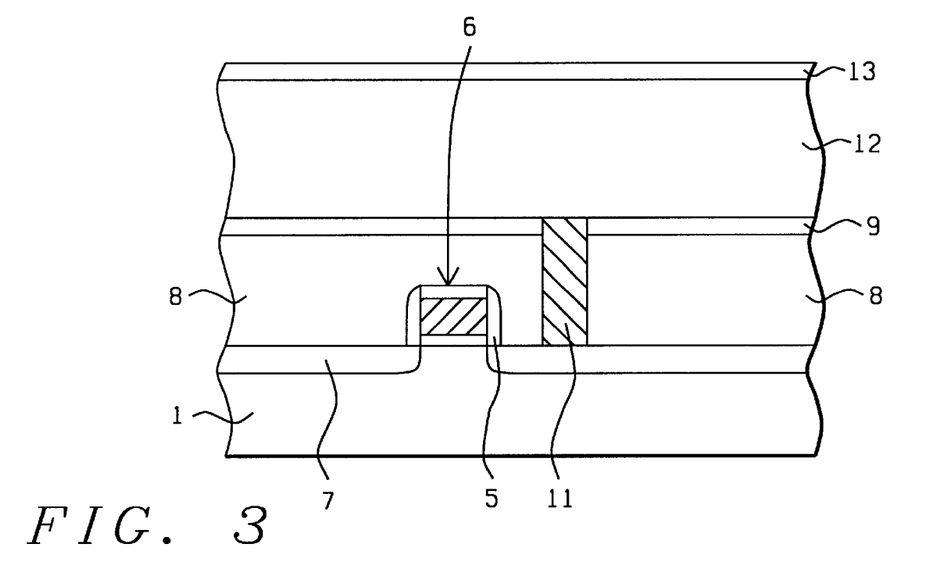
Figure 4:
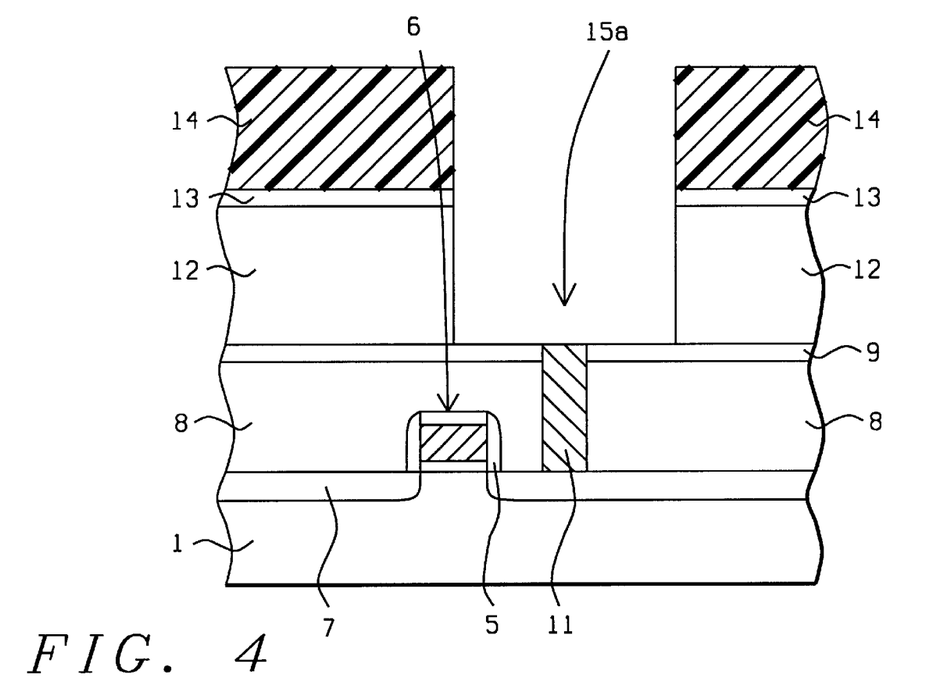

BPSG layer 12, is next deposited via LPCVD or PECVD procedures, to a thickness between about 15,000 to 20,000 Angstroms. The thickness of BPSG layer 12, will determine the height of the vertical features of a subsequent cylindrical shaped, storage node structure. If desired silicon oxide can be used in place of BPSG layer 12. A thin silicon nitride layer 13, is then deposited on BPSG layer 12, via LPCVD or PECVD procedures, at a thickness between about 500 to 2000 Angstroms. The result of these depositions are schematically shown in FIG. 3. Photoresist shape 14, is next formed, and used as an etch mask to define capacitor opening 15a, in silicon nitride layer 13, and in BPSG layer 12, via anisotropic RIE procedures, using $CF_4$ or $CHF_3$ as an etchant. Capacitor opening 15a, schematically shown in FIG. 4, exposes the top surface of storage node contact structure 11. Photoresist shape 14, is then removed via plasma oxygen ashing and careful wet cleans.

Figure 5:
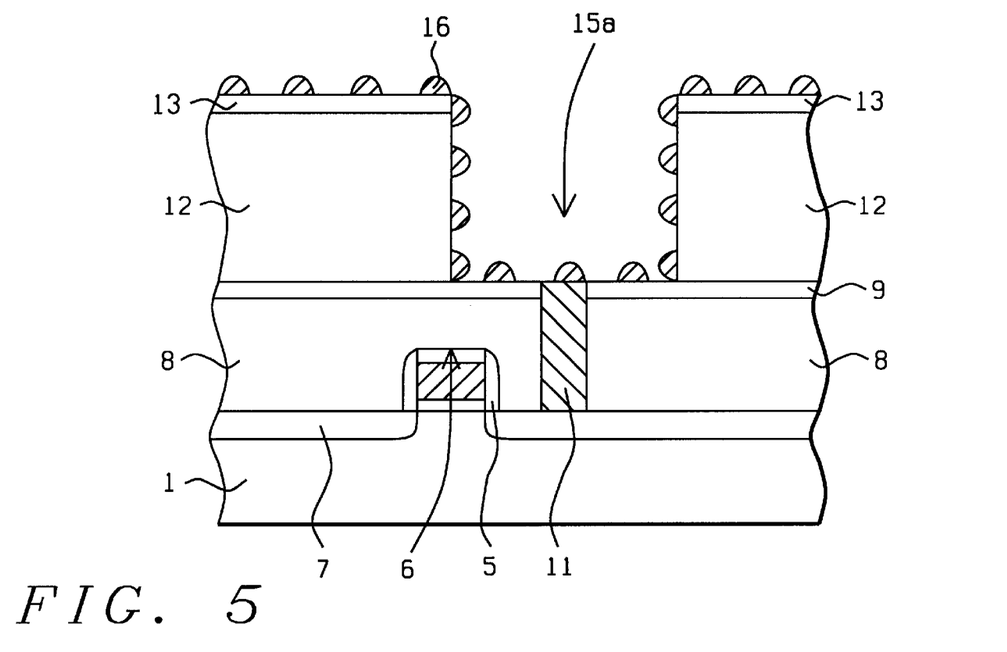
Figure 6:
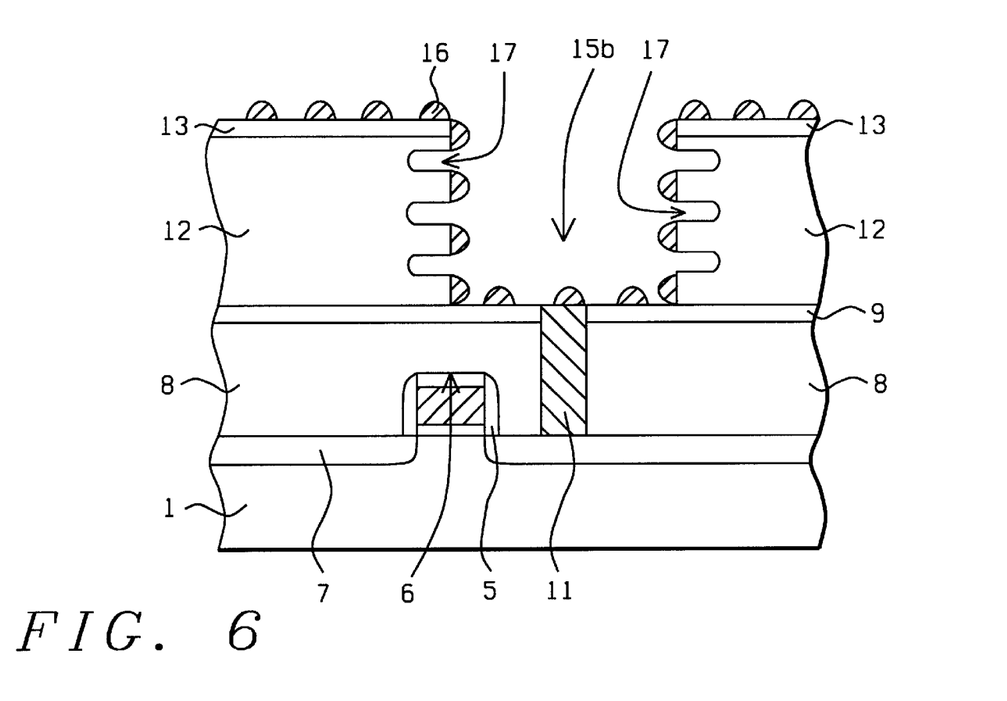

A critical deposition—anneal procedure, used to from isolated, or discrete regions of polysilicon, or hemispherical grain (HSG), silicon, is next addressed, Deposition of polysilicon is accomplished via LPCVD procedures, at a temperature between about 500 to 550° C., resulting in a non-continuous layer of silicon seeds, located on exposed surfaces. An anneal procedure, performed at a temperature between about 550 to 580° C., at a pressure between about 0.01 to 0.5 torr, and for a time between about 3 to 30 min, converts the silicon seeds to a discontinuous layer comprised of discrete regions 16, of polysilicon, or HSG silicon, The size of a discrete rugged polysilicon, or HSG region is between about 1500 to 3000 Angstroms, and the space between regions 16, which will subsequently determine the width of horizontal grooves in capacitor opening 15a, is between about 2000 to 4000 Angstroms. This is schematically shown in FIG. 5. A critical isotropic etch is next performed to form horizontal grooves 17, in BPSG layer 12, using either a wet etchant such buffered hydrofluoric acid, or via a dry etch procedure, using $CF_4$ as an etchant. Discrete rugged polysilicon, or HSG regions 16, behave as a mask protecting the covered portions of BPSG layer 12, from the selective etching procedure. The width of horizontal grooves 17, schematically shown in FIG. 6, are between about 2000 to 4000 Angstroms, extending between about 500 to 3000 Angstroms into BPSG layer 12, resulting in a capacitor opening 15b, with the surface area of capacitor opening 15b, now increased by the dimensions of horizontal grooves 17.

Figure 7:
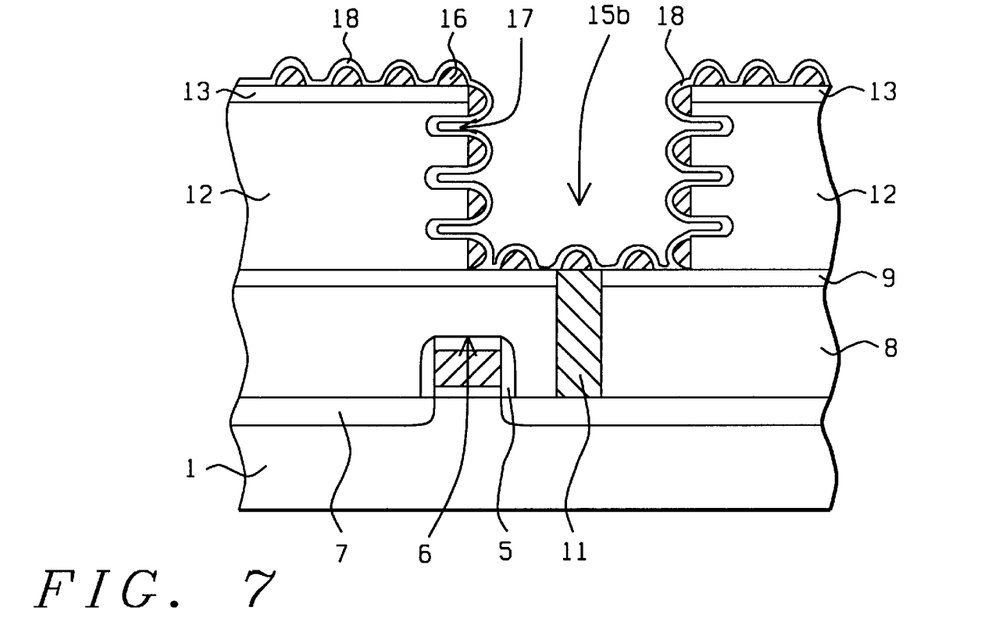
Figure 8:
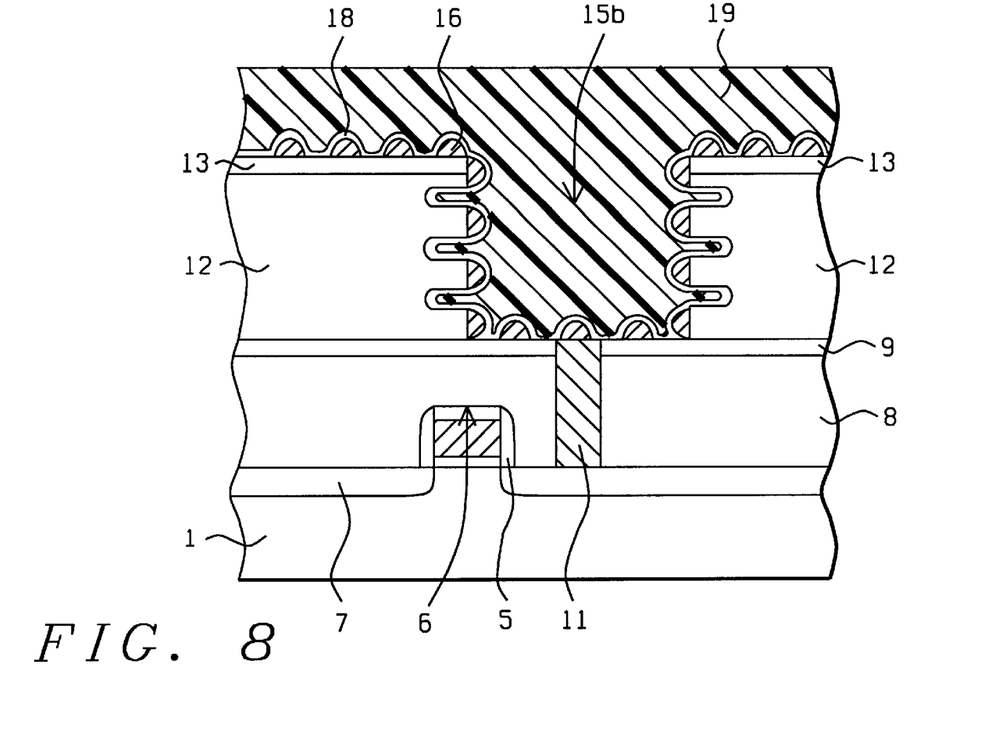
Figure 9:
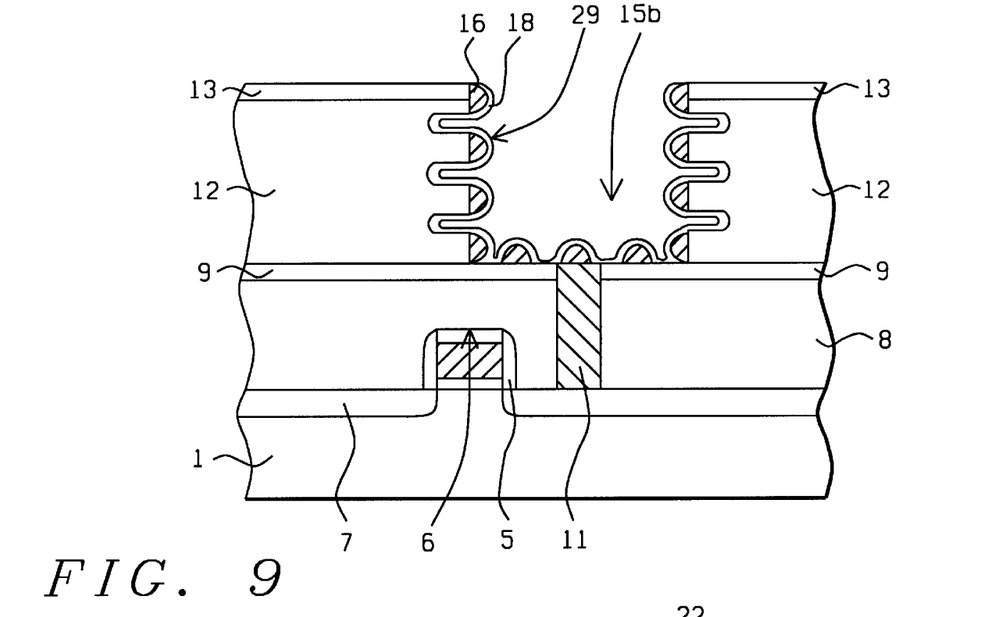

Amorphous silicon layer 18, is next deposited via LPCVD procedures, to a thickness between about 300 to 600 Angstroms. Amorphous silicon layer 18, shown schematically in FIG. 7, is a continuous layer, overlying discrete rugged polysilicon, or HSG silicon regions 16, as well as coating the exposed surfaces of horizontal grooves 17. Since the width of horizontal grooves is greater than twice the thickness of amorphous silicon layer 18, the horizontal grooves will not be completely filled. Amorphous silicon layer 18, is in situ doped during deposition, via the addition of arsine, or phosphine, to a silane ambient. Photoresist shape 19, is next formed, completely filling capacitor opening 15b. This is schematically shown in FIG. 8. A selective CMP procedure is then employed to remove regions of photoresist shape 19, regions of amorphous silicon layer 18, and the portions of the regions of discrete rugged polysilicon, or HSG silicon 16, from the top surface of silicon nitride layer 13, resulting in storage node structure 29, schematically shown in FIG. 9. The surface area of storage node structure 29, in capacitor opening 15b, has been increased as a result of the additional surface area provided by horizontal grooves 17. The portion of photoresist shape 19, located in capacitor opening 15b, not removed by the CMP procedure, is now removed via plasma oxygen ashing and careful wet cleans.

Figure 10:
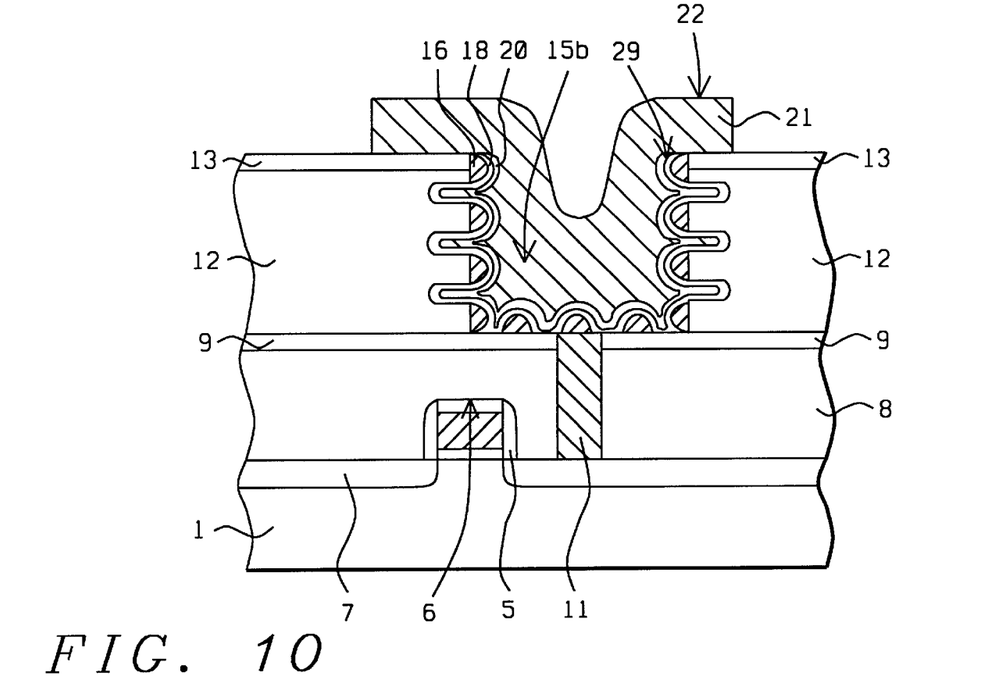

The completion of the fabrication of the fin type, cylindrical shaped capacitor structure is next addressed and schematically shown in FIG. 10. A capacitor dielectric layer 20, comprised of a dielectric layer chosen from a group that contains; tantalum oxide, silicon oxide, and silicon nitride, is formed on storage node structure 29, at a thickness between about 40 to 80 Angstroms. A polysilicon layer is then deposited via LPCVD procedures, at a thickness between about 1000 to 2000 Angstroms, with the polysilicon layer doped in situ during deposition via the addition of arsine, or phosphine, to a silane ambient. A photoresist shape, not shown in the drawings, is employed as an etch mask to allow an anisotropic RIE procedure, using $Cl_2$ or $SF_6$ as an etchant, to define polysilicon top electrode structure 21. The anisotropic RIE procedure also removes the portions of capacitor dielectric layer 20, not covered by the defined polysilicon top electrode structure 21. Removal of the photoresist shape, used for definition of polysilicon top electrode structure 21, is accomplished via plasma oxygen ashing and careful wet cleans. Fin type, cylindrical shaped DRAM capacitor structure 22, shown schematically in FIG. 10, is comprised of polysilicon top electrode structure 21, capacitor dielectric layer 20, and storage node structure 29, located in capacitor opening 15b, which in turn has been defined with horizontal grooves for purposes of increasing surface area.

Figure 11:
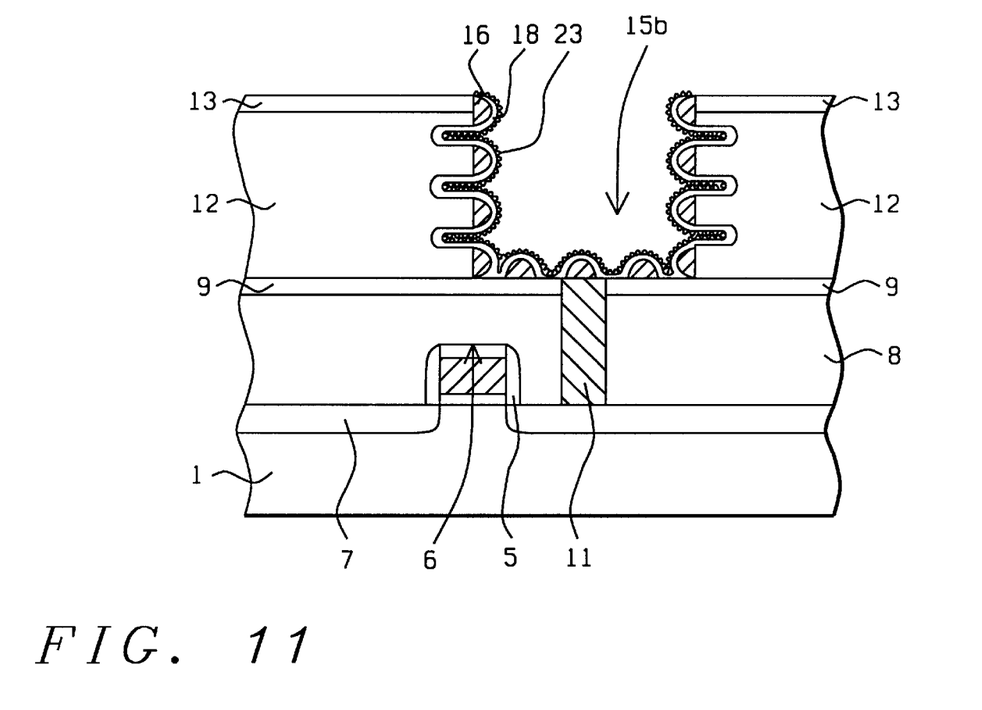

An additional embodiment of this invention, used to increase capacitor surface area, is next addressed and schematically shown in FIG. 11. After deposition of amorphous silicon layer 18, on discrete rugged polysilicon, or HSG silicon regions 16, and on the exposed surfaces of horizontal grooves 17, HSG silicon layer 23, is deposited. HSG silicon layer 23, is formed via growth of an HSG silicon seed layer on amorphous silicon layer 18, followed by an anneal cycle, converting the HSG silicon seed layer to HSG silicon layer 23. The combination of horizontal grooves 17, and HSG silicon layer 23, results in an increase in storage node surface area, and thus increased capacitance, when compared to counterparts fabricated without the use of this combination.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a capacitor structure, for a dynamic random access memory (DRAM), device, on a semiconductor substrate, comprising the steps of:

forming a storage node plug structure in an opening in a first composite insulator layer, with said storage node plug structure overlying and contacting a source/drain region of a transfer gate transistor;

forming a first capacitor opening in a second composite insulator layer, exposing the top surface of said storage node plug structure;

forming discrete regions of silicon on the top surface of said second composite insulator layer, and on all exposed surfaces of said first capacitor opening;

using said discrete regions of silicon as an etch mask to create horizontal channels in sides of an underlying, thick insulator component of said second composite insulator layer, exposed in said first capacitor opening, resulting in the creation of a second capacitor opening comprised with additional surface area provided by said horizontal channels;

depositing an amorphous silicon layer;

removal of portions of said amorphous silicon layer, and of portions of said discrete regions of silicon, from the top surface of said second composite insulator layer, to form a storage node structure in said second capacitor opening;

forming a capacitor dielectric layer on said storage node structure; and forming a top electrode structure on said capacitor dielectric layer.

2. The method of claim 1, wherein said first composite insulator layer is comprised of an underlying layer of boro-phosphosilicate glass (BPSG), obtained via LPCVD or PECVD procedures, at a thickness between about 3000 to 7000 Angstroms, and an overlying silicon nitride layer, obtained via LPCVD or PECVD procedures, at a thickness between about 500 to 1500 Angstroms.

3. The method of claim 1, wherein said storage node plug structure is comprised of doped polysilicon.

4. The method of claim 1, wherein said second composite insulator layer is comprised of an underlying layer of boro-phosphosilicate glass (BPSG), obtained via LPCVD or PECVD procedures, at a thickness between about 15,000 to 20,000 Angstroms, and an overlying silicon nitride layer, obtained via LPCVD or PECVD procedures, at a thickness between about 500 to 2000 Angstroms.

5. The method of claim 1, wherein said first capacitor opening is formed in said second composite insulator layer via an anisotropic RIE procedure, using $CF_4$ or $CHF_3$ as an etchant.

6. The method of claim 1, wherein said discrete regions of silicon are comprised of rugged polysilicon, or comprised of hemispherical grain (HSG), silicon, formed via an LPCVD of a non-continuous layer of silicon seeds, performed at a temperature between about 500 to 550° C., then annealed at a temperature between about 550 to 580° C., at a pressure between about 0.01 to 0.5 torr, for a time between about 3 to 30 min, to form a non-continuous layer of said discrete regions of silicon.

7. The method of claim 1, wherein the space between said discrete regions of silicon, is between about 2000 to 4000 Angstroms.

8. The method of claim 1, wherein said horizontal channels in sides of underlying, thick insulator component of said second composite insulator layer, are formed via an isotropic, buffered hydrofluoric acid wet etch procedure, or via a dry etch procedure using $CF_4$ as an etchant.

9. The method of claim 1, wherein said horizontal channels are comprised with a width between about 2000 to 4000 Angstroms, and extend into underlying, thick insulator component of said second composite insulator layer between about 500 to 3000 Angstroms.

10. The method of claim 1, wherein said amorphous silicon layer is obtained via LPCVD procedures to a thickness between about 300 to 600 Angstroms.

11. The method of claim 1, wherein said storage node structure is defined in said second capacitor opening via CMP removal of regions of said amorphous silicon layer, and of said discrete regions of silicon, from the top surface of said second composite insulator layer.

12. A method of forming a fin type, cylindrical shaped DRAM capacitor structure, on a semiconductor substrate, comprising the steps of:

providing a transfer gate transistor comprised of a gate structure on an underlying gate insulator layer, with insulator spacers located on the sides of said gate structure, and with a source/drain region located in a region of said semiconductor substrate not covered by said gate structure or by said insulator spacers;

depositing a first boro-phosphosilicate glass (BPSG), layer;

planarizing said first BPSG layer;

depositing a first silicon nitride layer;

forming a storage node contact hole in said first silicon nitride layer, and in said first BPSG layer, exposing a portion of a top surface of said source/drain region;

forming a polysilicon plug structure in said storage node contact hole;

depositing a second BPSG layer;

depositing a second silicon nitride layer;

forming a first capacitor opening in said second silicon nitride layer and in said second BPSG layer, exposing the top surface of said polysilicon plug structure;

depositing a non-continuous layer of discrete silicon seeds;

performing an anneal procedure to convert said non-continuous layer of discrete regions of silicon seeds to a non-continuous layer of discrete silicon regions;

performing an isotropic etch to create horizontal channels in the sides of said second BPSG layer, exposed in said first capacitor opening and not protected by said non-continuous layer of discrete regions of silicon, resulting in a second capacitor opening, comprised with increased surface area provided by said horizontal channels;

depositing an amorphous silicon layer on said non-continuous layer of discrete regions of silicon, and on surfaces of said horizontal channels;

forming a photoresist shape in said second capacitor opening;

removing portions of said amorphous silicon, and of said non-continuous layer of discrete regions of silicon, from the top surface of said second silicon nitride layer to define a fin type, storage node structure in said second capacitor opening;

forming a capacitor dielectric layer on said fin type, storage node structure; and forming a polysilicon top electrode structure on said capacitor dielectric layer, resulting in said fin type, cylindrical shaped DRAM capacitor structure, in said second capacitor opening, comprised of said polysilicon top electrode structure, said capacitor dielectric layer, and said fin type, storage node structure.

13. The method of claim 12, wherein said first borophosphosilicate glass (BPSG), layer is obtained via LPCVD or PECVD procedures, at a thickness between about 3000 to 7000 Angstroms.

14. The method of claim 12, wherein said first BPSG layer is planarized using a chemical mechanical polishing (CMP), procedure.

15. The method of claim 12, wherein said first silicon nitride layer is obtained via LPCVD or PECVD procedures, at a thickness between about 500 to 1500 Angstroms.

16. The method of claim 12, wherein said storage node plug structure is comprised of doped polysilicon.

17. The method of claim 12, wherein said second BPSG layer is obtained via LPCVD or PECVD procedures, at a thickness between about 15,000 to 20,000 Angstroms.

18. The method of claim 12, wherein said second silicon nitride layer is obtained via LPCVD or PECVD procedures, at a thickness between about 500 to 2000 Angstroms.

19. The method of claim 12, wherein said first capacitor opening is formed in said second silicon nitride layer, and in said second BPSG layer, via an anisotropic RIE procedure, using $CF_4$ or $CHF_3$ as an etchant.

20. The method of claim 12, wherein said non-continuous layer of discrete regions of silicon are comprised of rugged polysilicon, or comprised of hemispherical grain (HSG), silicon, formed via LPCVD procedures of said non-continuous layer of silicon seeds, deposited at a temperature between about 500 to 550° C., then annealed at a temperature between about 550 to 580° C., at a pressure between about 0.01 to 0.5 torr, for a time between about 3 to 30 min, to form said non-continuous layer of said discrete regions of silicon.

21. The method of claim 12, wherein the space between discrete regions of silicon in said non-continuous layer of discrete silicon regions, is between about 2000 to 4000 Angstroms.

22. The method of claim 12, wherein said horizontal channels in sides of second BPSG layer, located in said first capacitor opening, are formed via an isotropic, buffered hydrofluoric acid wet etch procedure, or via an isotropic, dry etch procedure using $CF_4$ as an etchant.

23. The method of claim 12, wherein said horizontal channels are comprised with a width between about 2000 to 4000 Angstroms, and extend into said second BPSG layer, between about 500 to 3000 Angstroms.

24. The method of claim 12, wherein said amorphous silicon layer is obtained via LPCVD procedures to a thickness between about 300 to 600 Angstroms.

25. The method of claim 12, wherein said fin type, storage node structure is defined in said second capacitor opening via CMP removal of regions of said amorphous silicon layer, and of said non-continuous layer of discrete regions of silicon, from the top surface of said second silicon nitride layer.

26. The method of claim 12, wherein said capacitor dielectric layer is chosen from a group that contains; tantalum oxide, silicon oxide, and silicon nitride, formed at a thickness between about 40 to 80 Angstroms.

* * * * *